(12) United States Patent
Xia

(10) Patent No.: US 10,566,352 B2
(45) Date of Patent: Feb. 18, 2020

(54) ARRAY SUBSTRATE AND MANUFACTURING METHOD THEREOF

(71) Applicant: Shenzhen China Star Optoelectronics Semiconductor Display Technology Co., Ltd., Shenzhen (CN)

(72) Inventor: Hui Xia, Shenzhen (CN)

(73) Assignee: Shenzhen China Star Optoelectronics Semiconductor Display Technology Co., Ltd., Guangdong (CN)

(*) Notice: Subject to any disclaimer, the term of this patent is extended or adjusted under 35 U.S.C. 154(b) by 0 days.

(21) Appl. No.: 15/749,127

(22) PCT Filed: Jan. 4, 2018

(86) PCT No.: PCT/CN2018/071229
§ 371 (c)(1),
(2) Date: Jan. 31, 2018

(87) PCT Pub. No.: WO2019/109443
PCT Pub. Date: Jun. 13, 2019

(65) Prior Publication Data
US 2019/0181154 A1    Jun. 13, 2019

(30) Foreign Application Priority Data
Dec. 7, 2017 (CN) .......................... 2017 1 1283181

(51) Int. Cl.
*H01L 27/12* (2006.01)
*H01L 51/00* (2006.01)
*H01L 27/32* (2006.01)

(52) U.S. Cl.
CPC .......... *H01L 27/124* (2013.01); *H01L 27/127* (2013.01); *H01L 27/1288* (2013.01); *H01L 51/0097* (2013.01); *H01L 27/3276* (2013.01)

(58) Field of Classification Search
CPC .......... H01L 51/0097; H01L 2251/5338; H01L 21/02348; G02F 1/133305
See application file for complete search history.

(56) References Cited

U.S. PATENT DOCUMENTS

| | | | |
|---|---|---|---|
| 2007/0026585 A1* | 2/2007 | Wong | H01L 29/41733 438/151 |
| 2014/0138637 A1* | 5/2014 | Yang | H01L 27/1218 257/40 |
| 2015/0270491 A1* | 9/2015 | Koizumi | C09D 5/24 257/40 |
| 2016/0226024 A1* | 8/2016 | Park | H01L 51/5256 |
| 2016/0362512 A1* | 12/2016 | Apostolo | C08F 214/18 |
| 2018/0366663 A1* | 12/2018 | Furuie | H01L 51/0097 |

* cited by examiner

*Primary Examiner* — Stephen M Bradley
(74) *Attorney, Agent, or Firm* — Mark M. Friedman

(57) ABSTRACT

A method of manufacturing an array substrate is provided. The method divides an array substrate into a curing area and a stretchable area. A metal wiring corresponding to the stretchable area is made of a flexible conductive material, so as to reduce disconnection risk of the display panel during bending.

10 Claims, 4 Drawing Sheets

ARRAY SUBSTRATE AND MANUFACTURING METHOD THEREOF

FIELD OF INVENTION

This disclosure relates to the field of display panel manufacturing, and more particularly to an array substrate and a manufacturing method thereof.

BACKGROUND OF INVENTION

With continuous improvement display technology quality, wearable applications such as smart glasses, smart watches are widely used, demand for flexible display devices is also increasing.

In prior flexible display devices, almost all organic light emitting display (OLED) panels are used because the OLED itself has luminescence, so no backlight is needed, thereby improving advantages of the flexible displays.

In current manufacturing methods of a flexible OLED display panel, a bendable flexible OLED display panel is realized by disposing an OLED light-emitting device and a thin-film transistor (TFT) device on a surface of the flexible substrate. However, in the current manufacturing methods, metal wiring material located on the surface of the array substrate is relatively fragile, which is easily broken during bending process, thereby increasing disconnection risks and further affecting quality of the flexible OLED display panel.

Thus, it is necessary to provide an array substrate and a method of manufacturing an array substrate to solve the problems of the prior art.

SUMMARY OF INVENTION

The object of the present invention to provide a method of manufacturing an array substrate for forming a curing area and a stretchable area on an array substrate, and a metal wiring corresponding to a stretchable area is made of a flexible conductive material, so as to reduce the risk of disconnection of the display panel during being bent.

In the present disclosure, one solution adopted to solve the above problem of the prior art is to provide an array substrate and a manufacturing method thereof. The technical options are as follows.

This disclosure provides a method for manufacturing an array substrate, comprising:

a step S10 of providing a substrate made of an insulating material, wherein the insulating material is configured to stretch under tension and/or shrink under pressure;

a step S20 of providing a thin film transistor on a surface of the substrate, wherein the thin film transistor includes an active layer, and further includes a source electrode, a drain electrode and a gate electrode all made of conductive materials, and the conductive materials are configured to stretch under tension and/or shrink under pressure;

a step S30 of forming a flattening layer on the surface of the substrate; and a step S40 of forming a patterned shading layer on a surface of the flattening layer, and defining a curing area and a stretchable area of the array substrate by the patterned shading layer;

wherein the curing area covers at least the active layer of the thin film transistor, and wherein the stretchable area is an area excluding the curing area.

In accordance with one embodiment, the invention is directed towards a method of manufacturing the array substrate, the curing area covers at least the active layer of the thin film transistor, and an area excluding the curing area is defined as the stretchable area.

In accordance with one embodiment, the invention is directed towards a method of manufacturing the array substrate, wherein the thin film transistor on the surface of the substrate in step S20 further comprises:

a step S201 of forming a first patterned layer on the surface of the substrate, wherein the first patterned layer comprises the source electrode and the drain electrode of the thin film transistor;

a step S202 of forming the active layer between the source electrode and the drain electrode, wherein two ends of the active layer overlap surfaces of the source electrode and the drain electrode, respectively;

a step S203 of forming a gate insulating layer on the surface of the substrate, wherein the active layer and a part of the source electrode and the drain electrode are covered with the gate insulating layer;

a step S204 of forming a second insulating layer on the surface of the substrate, wherein the second insulating layer is made of a material same as material of the substrate; and a step S205 of forming the gate electrode on the surface of the second insulating layer, wherein a partial region of the gate electrode corresponds to and is located above the active layer.

In accordance with one embodiment, the invention is directed towards a method of manufacturing the array substrate, wherein the step S201 further comprises:

forming a pattern layer of the source electrode and the drain electrode by a deposition process on the surface of the substrate, through an ink printing process; or the step S201 comprises:

a step S2011 of forming an electrode material layer on the surface of the substrate by a deposition process;

a step S2012 of forming a photoresist layer on a surface of the electrode material layer; and a step S2013 of performing a mask exposure process on the photoresist layer, developing the photoresist layer, and then etching the electrode material layer in an exposed area, so as to form the source electrode and the drain electrode.

In accordance with one embodiment, the invention is directed towards a method of manufacturing the array substrate, wherein the step S201 further comprises:

providing a data line on the surface of the substrate, wherein the data line is connected to the source electrode, and the data line is made of a material same as material of the source electrode.

In accordance with one embodiment, the invention is directed towards a method of manufacturing the array substrate, wherein the step S205 further comprises:

providing a scan line on the surface of the second insulating layer, wherein the scan line is connected to the gate electrode, and the scan line is made of a material same as material of the gate electrode.

In accordance with one embodiment, the invention is directed towards a method of manufacturing the array substrate. Material of the source electrode, the drain electrode, the gate electrode, the data line and the scan line is a stretchable conductive flexible polymer composite material doped with carbon nanotubes.

Another object of the present invention is to provide a method of manufacturing an array substrate, comprising:

a step S10 of providing a substrate made of an insulating material, wherein the insulating material is configured to stretch under tension and/or shrink under pressure;

a step S20 of providing a thin film transistor on a surface of the substrate, wherein the thin film transistor includes an active layer, and further includes a source electrode, a drain electrode and a gate electrode all made of conductive materials, and the conductive materials are configured to stretch under tension and/or shrink under pressure;

a step S30 of forming a flattening layer on the surface of the substrate; and a step S40 of forming a patterned shading layer on the surface of the flattening layer, and defining a curing area and a stretchable area of the array substrate by the patterned shading layer.

In accordance with one embodiment, the invention is directed towards a method of manufacturing the array substrate, wherein the thin film transistor on the surface of the substrate in step S20 further comprises:

a step S201 of forming a first patterned layer on the surface of the substrate, wherein the first patterned layer comprises the source electrode and the drain electrode of the thin film transistor;

a step S202 of forming the active layer between the source electrode and the drain electrode, wherein two ends of the active layer overlap surfaces of the source electrode and the drain electrode, respectively;

a step S203 of forming a gate insulating layer on the surface of the substrate, wherein the active layer and a part of the source electrode and the drain electrode are covered with the gate insulating layer;

a step S204 of forming a second insulating layer on the surface of the substrate, wherein the second insulating layer is made of a material same as material of the substrate; and a step S205 of forming the gate electrode on the surface of the second insulating layer, wherein a partial region of the gate electrode corresponds to and is located above the active layer.

In accordance with one embodiment, the invention is directed towards a method of manufacturing the array substrate, wherein the step S201 further comprises:

forming a pattern layer of the source electrode and the drain electrode by a deposition process on the surface of the substrate, through an ink printing process; or the step S201 comprises:

a step S2011 of forming an electrode material layer on the surface of the substrate by a deposition process;

a step S2012 of forming a photoresist layer on a surface of the electrode material layer; and a step S2013 of performing a mask exposure process on the photoresist layer, developing the photoresist layer, and then etching the electrode material layer in an exposed area, so as to form the source electrode and the drain electrode.

In accordance with one embodiment, the invention is directed towards a method of manufacturing the array substrate, wherein the step S201 further comprises:

providing a data line on the surface of the substrate, wherein the data line is connected to the source electrode, and the data line is made of a material same as material of the source electrode.

In accordance with one embodiment, the invention is directed towards a method of manufacturing the array substrate, wherein the step S205 further comprises:

providing a scan line on the surface of the second insulating layer, wherein the scan line is connected to the gate electrode, and the scan line is made of a material same as material of the gate electrode.

In accordance with one embodiment, the invention is directed towards a method of manufacturing the array substrate. Material of the source electrode, the drain electrode, the gate electrode, the data line and the scan line is a stretchable conductive flexible polymer composite material doped with carbon nanotubes.

According to the above object, the present invention further provides an array substrate, which comprising:

a substrate made of an insulating material, wherein the insulating material is configured to stretch under tension and/or shrink under pressure;

a thin film transistor disposed on a surface of the substrate, wherein the thin film transistor includes an active layer, and further includes a source electrode, a drain electrode and a gate electrode all made of conductive materials, and the conductive materials are configured to stretch under tension and/or shrink under pressure; and a curing area and a stretchable area both defined on the array substrate;

wherein the curing area covers at least the active layer of the thin film transistor, and wherein the stretchable area is an area excluding the curing area.

In accordance with one embodiment, the invention is directed towards an array substrate, which further comprising:

an insulating layer disposed on the surface of the substrate, and the insulating layer coated on the thin film transistor, wherein the insulating layer is made of a material same as material of the substrate.

In accordance with one embodiment, the invention is directed towards an array substrate, which further comprising:

a data line connected to the source electrode of the thin film transistor; and a scan line connected to the gate electrode of the thin film transistor;

wherein the material of the data line, the scan line, the source electrode, the drain electrode and the gate electrode is a stretchable conductive flexible polymer composite material doped with carbon nanotubes.

In comparison with a conventional array substrate. It is an advantage of the disclosure to provide a method of manufacturing an array substrate capable of forming a curing area and a stretchable area on an array substrate, and a metal wiring corresponding to the stretchable area is made of a flexible conductive material, so as to reduce disconnection risk of the display panel during bending process. Accordingly, the disclosure can solve the technical problems of the flexible display device in the prior art, in which the metal wiring material located on a surface of the array substrate during the bending process easily disconnects, thereby affecting quality of the flexible OLED display panel.

DESCRIPTION OF DRAWINGS

In order to more clearly describe the embodiments of this disclosure or the conventional technical solutions, the description is used to make a simple introduction of the drawings used in the following embodiments. The following description of the drawings are merely some embodiments of this disclosure. In order, more clearly describe the embodiments of this disclosure or the conventional technical solutions, the description is used to make a simple introduction of the drawings used in the following embodiments. The following description of the drawings are merely some embodiments of this disclosure. Those of ordinary skill in the art can also obtain other drawings based on these drawings without creative effort.

DETAILED DESCRIPTION OF PREFERRED EMBODIMENTS

Figure 1:
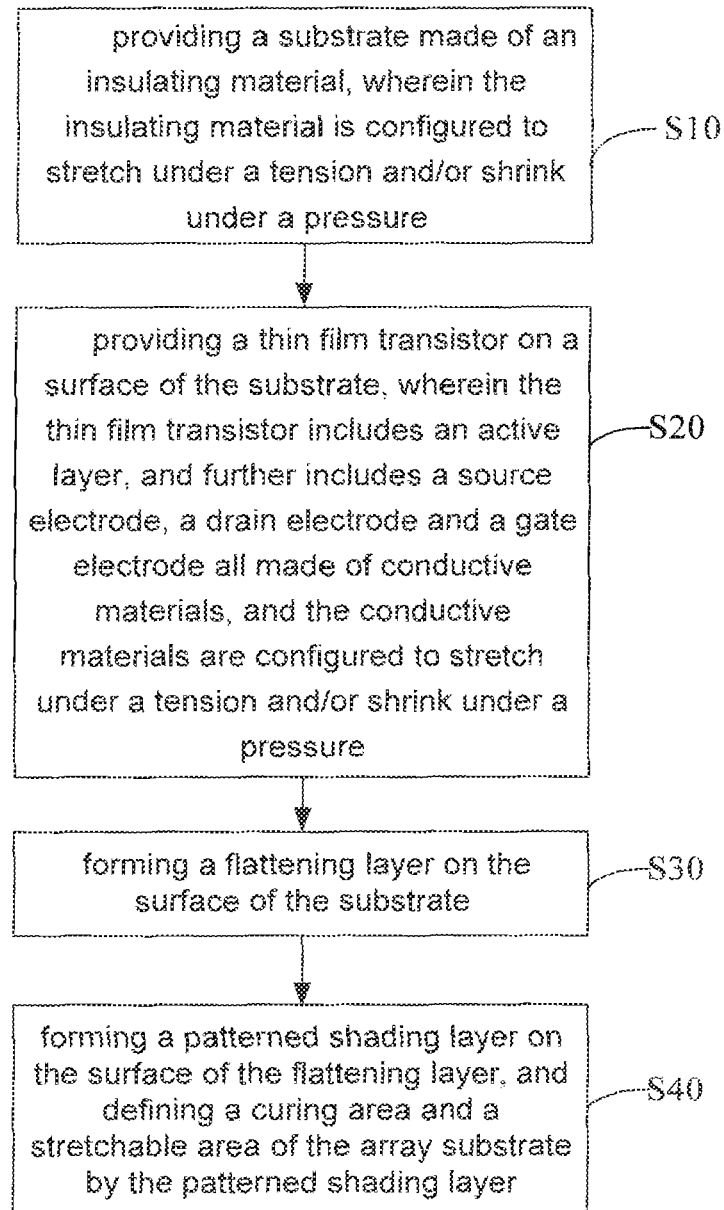
FIG. 1 is a step flowchart of a method of manufacturing an array substrate according to a preferred embodiment of this disclosure.

In order to more clearly describe the embodiments of this disclosure or the conventional technical solutions, the description is used to make a simple introduction of the drawings used in the following embodiments. The following description of the drawings are merely some embodiments of this disclosure, and the direction terms mentioned in the present invention, such as "upper", "lower", "front", "rear", "left", "right", "top", "bottom", etc., are only with reference to the attached figures and by to illustrate the invention and not to limit the invention. In the drawings, structurally similar elements are given the same reference numerals.

As mentioned, this disclosure is directed to the technical problem of the prior art of the flexible display device, may cause a metal wiring material located on the surface of the array substrate to easily disconnects during the bending process, and affecting the quality of the flexible OLED display panel. Therefore, the prior art technical problems that affect the quality of the flexible display device, embodiments of this disclosure can solve these disadvantages.

Referring to FIG. 1, a step flowchart of a method of manufacturing an array substrate according to a preferred embodiment of this disclosure is shown. As shown in FIG. 1, the preferred embodiment provides a method of manufacturing an array substrate, which comprising:

a step S10 of providing a substrate made of an insulating material, wherein the insulating material is configured to stretch under tension and/or shrink under pressure;

a step S20 of providing a thin film transistor on a surface of the substrate, wherein the thin film transistor includes an active layer, and further includes a source electrode, a drain electrode and a gate electrode all made of conductive materials, and the conductive materials are configured to stretch under tension and/or shrink under pressure;

a step S30 of forming a flattening layer on the surface of the substrate; and a step S40 of forming a patterned shading layer on the surface of the flattening layer, and defining a curing area and a stretchable area of the array substrate by the pattered shading layer.

Referring to FIG. 2A to FIG. 2I, a method of manufacturing an array substrate according to a preferred embodiment of this disclosure includes the following steps.

Figure 2A:
FIG. 2A to FIG. 2I are structural schematic view of corresponding steps of the method of manufacturing the array substrate according to a preferred embodiment of this disclosure.

In step S10, as shown in FIG. 2A, providing a substrate 201 made of an insulating material, and the insulating material is configured to stretch under tension and/or shrink under pressure. The insulating material is a stretching property organic material, and in part on the substrate 201 to form a curing area by irradiating UV light. The curing area has no tensile property.

In the present embodiment, the insulating material can be made of photosensitive polyimide material. A portion of the substrate 201 is covered by the curing area, that is, the curing area is irradiated with a curing light source so that the curing area is covered on the substrate 201, so as to achieve the curing effect of the corresponding area.

Figure 2B:
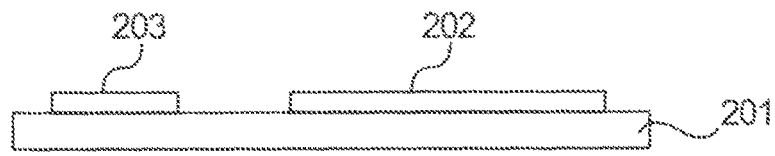

In step S20, as shown in FIG. 2B, a source electrode 202 and a drain electrode 203 of a thin film transistor formed on the surface of the substrate 201. For example, forming a pattern layer of the source electrode 202 and the drain electrode 203 by a deposition process on the surface of the substrate 201, through an ink printing process. Alternatively, forming the source electrode 202 and the drain electrode 203 through a mask and an etching process. The foregoing process includes: in a step S201, forming an electrode material layer on the entire surface of the substrate 201 by a deposition process; in a step S202, forming a photoresist layer on a surface of the electrode material layer; in a step S203, forming a photoresist pattern on the photoresist layer by a mask and an exposure process; in a step S204, developing the photoresist layer; in a step S205, etching the electrode material layer in the exposed area; and in a step S206, the photoresist layer is removed to form the source electrode 202 and the drain electrode 203.

In the present embodiment, forming the source electrode 202 and the drain electrode 203 in a same layer, and a channel is formed between the source 202 and the drain 203. Material of the source electrode 202 and the drain electrode 203 can be a stretchable conductive flexible polymer composite material doped with carbon nanotubes. Specifically, the composite material SCMs combined of a three-dimensional conductive network and a three-dimensional porous flexible polymer substrate with carbon nanotubes is formed. The composite material SCMs has strong toughness, and will not affect the connection between the conductive particles in the material after being stretched. Thereby ensuring that the conductive wires or electrodes formed on the composite material SCMs, which will not affect the electrical property after being stretched or compressed.

Figure 2C:
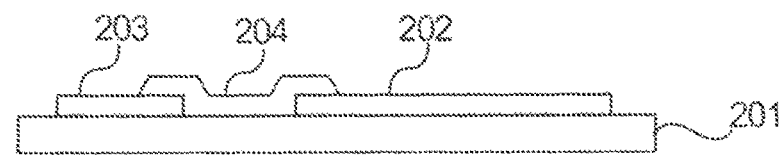

In step S30, as shown in FIG. 2C, forming an active layer 204 on the channel, which is located between the source 202 and the drain 203. The active layer 204. Two ends of the active layer 204 are overlapped on the surfaces of the source electrode 202 and the drain electrode 203, respectively. The carriers between the source electrode 202 and the drain electrode 203 may be moved mainly by the active layer 204 which performed. The active layer 204 needs to have a stable state in order to achieve normal movement of the carrier. Material of the active layer 204 can be a solution of carbon nanotubes semiconductor. Forming the active layer 204 in the curing area, the active layer 204 can be protected to avoid being bent.

Figure 2D:
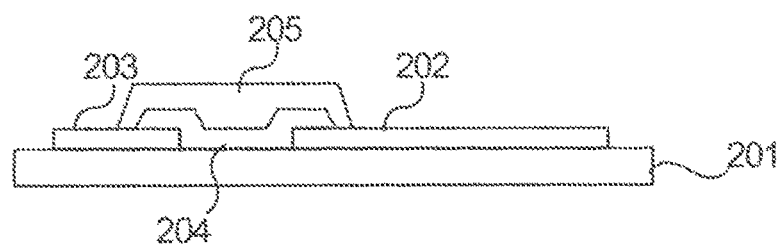

In step S40, as shown in FIG. 2D, forming a gate insulating layer 205 on the active layer 204. For example, forming a pattern of a gate insulating layer 205 by a deposition process on the surface of the active layer 204, through an ink printing process. Alternatively, forming the gate insulating layer 205 through a mask and an etching process. The foregoing process includes: in a step S401, forming an insulating material layer on the entire surface of the substrate 201 by a deposition process; in a step S402, forming a photoresist layer on a surface of the insulating material layer; in a step S403, forming a photoresist pattern on the photoresist layer by a mask and an exposure process; in a step S404, developing the photoresist layer; in a step S405, etching the electrode material layer in the exposed area; and in a step S406, the photoresist layer is removed to form the gate insulating layer 205.

Figure 2E:
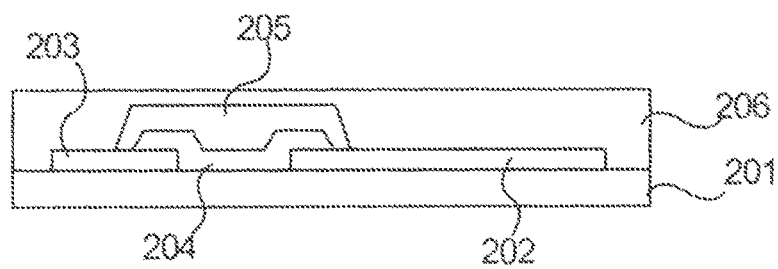

In step S50, as shown in FIG. 2E, forming a second insulating layer 206 on the surface of the substrate 201, wherein the second insulating layer 206 is made of a material same as material of the substrate 201. Forming the insulating material on the surface of the substrate 201 by an ink printing process. By a coating process, an insulating material is formed on the surface of the substrate 201 to form the second insulating layer 206 The second insulating layer 206 that has not undergone a curing process has the property of stretching and shrinking.

Figure 2F:
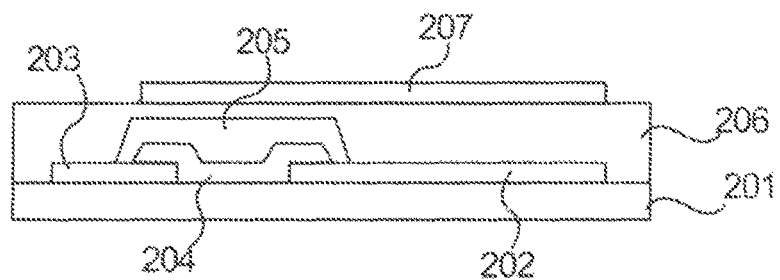

In step S60, as shown in FIG. 2F, forming a gate electrode 207 on the surface of the second insulating layer 206 by the ink printing process or the mask and etching process, and a partial region of the gate electrode 207 corresponds to and is located above the active layer.

Figure 2G:
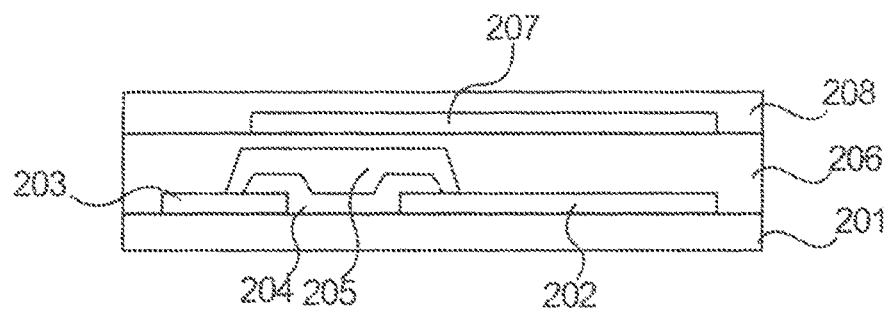

In step S70, as shown in FIG. 2G, by a coating process, an insulating material is formed on the surface of the second insulating layer 206 to form a flattening layer 208. The flattening layer 208 is made of an insulating material same as an insulating material of the second insulating layer 206 and the substrate.

Figure 2H:
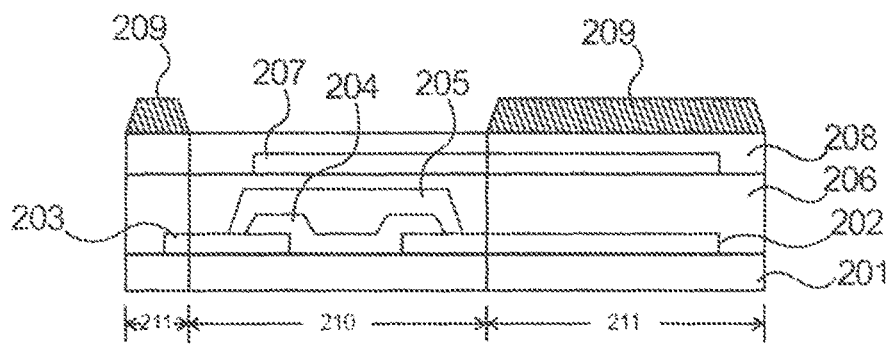

In step S80, as shown in FIG. 2H, forming a patterned shading layer 209 on the surface of the flattening layer. The region of the substrate 201 that is not covered by the patterned shading layer 209 will be cured, so as to define the curing area 210 and the stretchable area 211 of the array substrate.

In the present embodiment, irradiating the array substrate by a curing lamp, and the light enters the light-transmitting region of the patterned shading layer 209, and then making the light passes through the planarization layer 208, the second insulating layer 206 and the substrate 201 in sequence, so as to make the planarization layer 208, the second insulating layer 206 and the substrate 201 are cured, thereby defining the curing region 210 on the planarization layer 208, the second insulating layer 206 and the substrate 201. A light transmission area of the patterned shading layer 209 is smaller than a display area of a pixel unit. For example, a single light transmission area of the patterned shading layer 209 is equal to an area of a channel of a single thin film transistor, and the active layer 204 is located in the channel.

Furthermore, in present embodiment, in general, the curing lamp can be a UV lamp. Making the insulating material to configure as a substrate and a stretch-filled material, because the insulating material can be an organic material that is UV curable and having tensile and shrinking properties. After through UV light irradiation, both the insulating layer and the substrate in the area not covered by the patterned shading layer 209 are cured by UV light, so as to exhibit no tensile property and further form a curing area 210 different from the stretchable area 211. Thus, the insulating layer and the substrate located in the curing area 210 are not stretched to protect the important structure formed by the thin film transistor and other components from being covered, so that the whole array substrate is not affected by the external force when it is stretched, so as to maintain the overall original characteristics and structural properties of the array substrate.

Figure 2I:
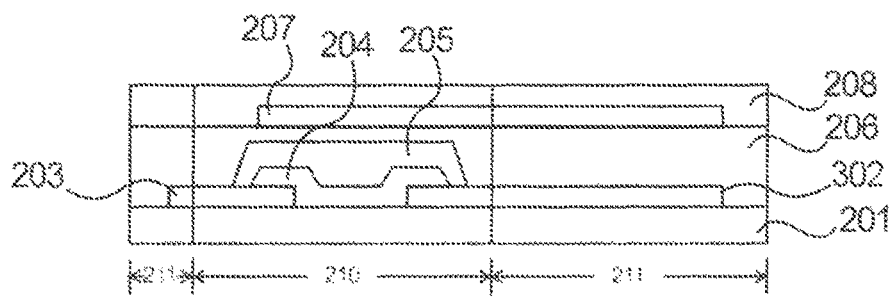

In step S90, as shown in FIG. 2I, the patterned light-shielding layer 209 in step 80 is removed to form the array substrate.

In the present embodiment, in order to ensure the normal rate of the carrier movement of the active layer 204 in step 30, the active layer 204 must be prevented from deforming. So that the curing area 210 can be covered at least with the active layer 204 of the thin film transistor, and an area excluding the curing area 210 as the stretchable area 211.

More specifically, at the same time that the source electrode 202 and the drain electrode 203 are formed on the thin film transistor in step 20, forming the data line on the surface of the substrate 201, and the source electrode 202 is connected to the data line. Wherein the manufacturing process of the data line is same as manufacturing process of the source electrode 202 and the drain electrode 203, and the data line is made of a material same as material of the source electrode 202 and the drain electrode 203.

More specifically, at the same time that the gate electrode 207 is formed on the surface of the second insulating layer 206 in step 20, forming the scan line on the surface of the second insulating layer 206, and the gate electrode 207 is connected to the scan line. The scan line is located on different side of the data line, perpendicular to each other. Wherein the manufacturing process of the scan lines is same as manufacturing process of the gate electrode 207, and the scan line is made of a material same as material of the gate electrode 207.

In the present embodiment, more specifically, the material of the source electrode 202, the drain electrode 203, the gate electrode 207, the data line, and the scan line can be a stretchable conductive flexible polymer composite material doped with carbon nanotubes.

More specifically, the array substrate obtained according to the above manufacturing method, the array substrate is configured under a tensile force, and the stretchable area 211 is elongated, and then the stretchable area 211 is contracted under the pressure. When deformation occurs, the film layers, the electrodes, the data lines and the scan lines of the array substrate also have the characteristics of stretching and shrinking so as not to affect the function of the array substrate. When deformation occurs, the film layers, the electrodes, the data lines and the scan lines of the array substrate also have the characteristics of stretching and shrinking, so as not to affect the function of the array substrate. Moreover, both the active layer 204 and the partial electrode covered by the curing area 210 are not affected by the pulling force and do not deform, so as to ensure the function of the thin film transistor to be normal.

Figure 3:
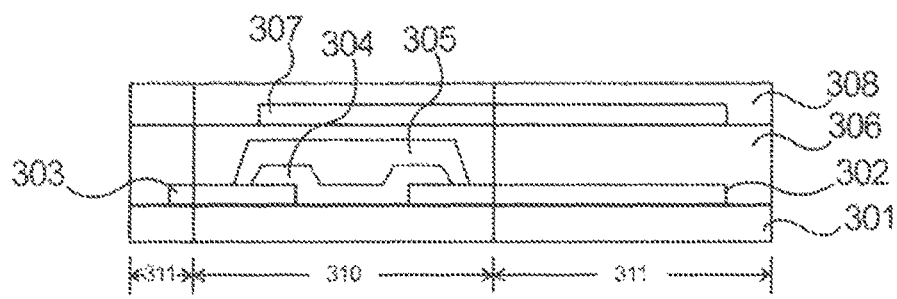
FIG. 3 is a structural schematic view of an array substrate obtained by the method of manufacturing an array substrate according to the present invention.

According to the above object, the present invention further provides an array substrate, as shown in FIG. 3, the array substrate comprising: providing a substrate made of an insulating material, and the insulating material is configured to stretch under tension and/or shrink under pressure. A thin film transistor is disposed on a surface of the substrate, and the thin film transistor includes an active layer, and a source electrode, a drain electrode, and a gate electrode all made of conductive materials, and the conductive materials are configured to stretch under tension and/or shrink under pressure. A curing area and a stretchable area are defined of the array substrate. Wherein the curing area covers at least the active layer of the thin film transistor, and an area excluding the curing area as the stretchable area.

More specifically, the array substrate further comprising: an insulating layer disposed on the surface of the substrate, and the insulating layer coated on the thin film transistor, wherein the insulating layer is made of a material same as material of the substrate.

In additional embodiments, the array substrate further comprising: a data line is connected to the source electrode of the thin film transistor; and a scan line is connected to the gate electrode of the thin film transistor. Wherein the material of the data line, the scan line, the source electrode, the drain electrode and the gate electrode can be a stretchable conductive flexible polymer composite material doped with carbon nanotubes.

Thus, the array substrate in the preferred embodiment is obtained according to the manufacturing method described above. For details, reference may be made to the working principle of the array substrate manufacturing method in the preferred embodiment described above, and details are not described herein again.

In comparison with a conventional array substrate. It is an advantage of the disclosure to provide a method of manufacturing an array substrate capable of forming a curing area and a stretchable area on an array substrate, and a metal wiring corresponding to the stretchable area is made of a flexible conductive material, so as to reduce disconnection risk of the display panel during bending process. Accordingly, the disclosure can solve the technical problems of the flexible display device in the prior art, in which the metal wiring material located on the surface of the array substrate during the bending process easily disconnects, thereby affecting the quality of the flexible OLED display panel.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive. The above disclosed subject matter is to be considered illustrative, and not restrictive, and the appended claims are intended to cover all such modifications, enhancements, and other embodiments, which fall within the true spirit and scope of the present invention.

What is claimed is:

1. A method of manufacturing an array substrate, comprising:
    a step S10 of providing a substrate made of an insulating material, wherein the insulating material is configured to stretch under tension and/or shrink under pressure;
    a step S20 of providing a thin film transistor on a surface of the substrate, wherein the thin film transistor includes an active layer, and further includes a source electrode, a drain electrode and a gate electrode all made of conductive materials, and the conductive materials are configured to stretch under tension and/or shrink under pressure;
    a step S201 of forming a first patterned layer on the surface of the substrate, wherein the first patterned layer comprises the source electrode and the drain electrode of the thin film transistor;
    a step S202 of forming the active layer between the source electrode and the drain electrode, wherein two ends of the active layer overlap surfaces of the source electrode and the drain electrode, respectively;
    a step S203 of forming a gate insulating layer on the surface of the substrate, wherein the active layer, a part of the source electrode, and the drain electrode are covered with the gate insulating layer;
    a step S204 of forming a second insulating layer on the surface of the substrate, wherein the second insulating layer is made of a same material as the material of the substrate;
    a step S205 of forming the gate electrode on the surface of the second insulating layer, wherein a partial region of the gate electrode corresponds to and is located above the active layer;
    a step S30 of forming a flattening layer on the surface of the substrate; and
    a step S40 of forming a patterned shading layer on a surface of the flattening layer, and defining a curing area and a stretchable area of the array substrate by the patterned shading layer;
    wherein the curing area covers at least the active layer of the thin film transistor, and wherein the stretchable area is an area excluding the curing area.

2. The method of manufacturing the array substrate according to claim 1, wherein the step S201 further comprises:
    forming a pattern layer of the source electrode and the drain electrode by a deposition process on the surface of the substrate through an ink printing process; or
    the step S201 comprises:
    a step S2011 of forming an electrode material layer on the surface of the substrate by a deposition process;
    a step S2012 of forming a photoresist layer on a surface of the electrode material layer; and
    a step S2013 of performing a mask exposure process on the photoresist layer, developing the photoresist layer, and then etching the electrode material layer in an exposed area, so as to form the source electrode and the drain electrode.

3. The method of manufacturing the array substrate according to claim 1, wherein the step S201 further comprises: providing a data line on the surface of the substrate, wherein the data line is connected to the source electrode, and the data line is made of a material same as material of the source electrode.

4. The method of manufacturing the array substrate according to claim 3, wherein the step S205 further comprises: providing a scan line on the surface of the second insulating layer, wherein the scan line is connected to the gate electrode, and the scan line is made of a material same as material of the gate electrode.

5. The method of manufacturing the array substrate according to claim 1, wherein the material of the source electrode, the drain electrode, the gate electrode, the data line and the scan line is a stretchable conductive flexible polymer composite material doped with carbon nanotubes.

6. A method of manufacturing an array substrate, comprising:
    a step S10 of providing a substrate made of an insulating material, wherein the insulating material is configured to stretch under tension and/or shrink under pressure;
    a step S20 of providing a thin film transistor on a surface of the substrate, wherein the thin film transistor includes an active layer, and further includes a source electrode, a drain electrode and a gate electrode all made of conductive materials, and the conductive materials are configured to stretch under tension and/or shrink under pressure;
    a step S201 of forming a first patterned layer on the surface of the substrate, wherein the first patterned layer comprises the source electrode and the drain electrode of the thin film transistor;
    a step S202 of forming the active layer between the source electrode and the drain electrode, wherein two ends of the active layer overlap surfaces of the source electrode and the drain electrode, respectively;

a step S203 of forming a gate insulating layer on the surface of the substrate, wherein the active layer, a part of the source electrode, and the drain electrode are covered with the gate insulating layer;

a step S204 of forming a second insulating layer on the surface of the substrate, wherein the second insulating layer is made of a same material as the material of the substrate;

a step S205 of forming the gate electrode on the surface of the second insulating layer, wherein a partial region of the gate electrode corresponds to and is located above the active layer;

a step S30 of forming a flattening layer on the surface of the substrate; and a step S40 of forming a pattern of a shading layer on the surface of the flattening layer, and defining a curing area and a stretchable area of the array substrate by the patterned shading layer.

7. The method of manufacturing the array substrate according to claim 6, wherein the step S201 further comprises:

forming a pattern layer of the source electrode and the drain electrode by a deposition process on the surface of the substrate through an ink printing process; or the step S201 comprises:

a step S2011 of forming an electrode material layer on the surface of the substrate by a deposition process;

a step S2012 of forming a photoresist layer on a surface of the electrode material layer; and a step S2013 of performing a mask exposure process on the photoresist layer, developing the photoresist layer, and then etching the electrode material layer in an exposed area, so as to form the source electrode and the drain electrode.

8. The method of manufacturing the array substrate according to claim 6, wherein the step S201 further comprises: providing a data line on the surface of the substrate, wherein the data line is connected to the source electrode, and the data line is made of a material same as material of the source electrode.

9. The method of manufacturing the array substrate according to claim 8, wherein the step S205 further comprises: providing a scan line on the surface of the second insulating layer, wherein the scan line is connected to the gate electrode, and the scan line is made of a material same as material of the gate electrode.

10. The method of manufacturing the array substrate according to claim 6, wherein the material of the source electrode, the drain electrode, the gate electrode, the data line and the scan line is a stretchable conductive flexible polymer composite material doped with carbon nanotubes.

* * * * *